United States Patent
Ho et al.

(10) Patent No.: US 9,768,092 B2
(45) Date of Patent: Sep. 19, 2017

(54) CARRIER PACKAGE AND CARRIER WITH PLURAL HEAT CONDUCTORS

(71) Applicant: Viking Tech Corporation, Hsinchu County (TW)

(72) Inventors: Chien-Hung Ho, Hsinchu County (TW); Chiu-Min Lee, Hsinchu County (TW); Chen-Shen Kuo, Hsinchu County (TW)

(73) Assignee: Viking Tech Corporation, Hukou Township (TW)

( * ) Notice: Subject to any disclaimer, the term of this patent is extended or adjusted under 35 U.S.C. 154(b) by 0 days.

(21) Appl. No.: 14/461,808

(22) Filed: Aug. 18, 2014

(65) Prior Publication Data
US 2015/0305201 A1 Oct. 22, 2015

(30) Foreign Application Priority Data
Apr. 16, 2014 (TW) .............................. 103113819 A

(51) Int. Cl.
| | |
|---|---|
| H01L 23/34 | (2006.01) |
| H05K 1/02 | (2006.01) |
| H01L 23/367 | (2006.01) |
| H01L 23/373 | (2006.01) |
| H05K 1/03 | (2006.01) |

(52) U.S. Cl.
CPC .......... *H01L 23/34* (2013.01); *H01L 23/3677* (2013.01); *H05K 1/0204* (2013.01); *H05K 1/0206* (2013.01); *H01L 23/3735* (2013.01); *H01L 2924/0002* (2013.01); *H05K 1/0306* (2013.01)

(58) Field of Classification Search
CPC .. H05K 1/0206; H05K 1/0204; H05K 1/0203; H05K 2201/066; H05K 1/0207; H05K 2201/09781; H05K 2201/09509; H05K 2201/09572; H05K 2201/09745; H05K 2201/09563; H05K 2201/09772
USPC .................................. 361/704–713, 720–722
See application file for complete search history.

(56) References Cited

U.S. PATENT DOCUMENTS

| | | | | |
|---|---|---|---|---|
| 4,897,338 A * | 1/1990 | Spicciati | ............... | H05K 3/4644 205/125 |
| 5,687,062 A * | 11/1997 | Larson | ................... | H01L 23/142 174/252 |
| 5,710,459 A * | 1/1998 | Teng | ....................... | H01L 23/10 257/704 |
| 5,856,911 A * | 1/1999 | Riley | ...................... | G06F 1/203 174/16.3 |
| 5,870,286 A * | 2/1999 | Butterbaugh | ....... | H01L 23/4093 165/80.2 |
| 2003/0058630 A1 * | 3/2003 | Takano | .................... | H01L 23/10 361/783 |

(Continued)

*Primary Examiner* — Adam B Dravininkas
(74) *Attorney, Agent, or Firm* — Davis & Bujold PLLC; Michael J. Bujold

(57) ABSTRACT

A carrier is disclosed, including: a main body having a first surface and a second surface opposing the first surface; a conductive part formed on the first surface of the main body; and a plurality of heat conductors that are not in contact with the conductive part and penetrate the main body to connect the first surface with the second surface. Therefore, heat generated by electronic elements can be effectively dissipated outside to improve the functionality and lifetime of electronic elements.

18 Claims, 5 Drawing Sheets

(56) References Cited

U.S. PATENT DOCUMENTS

| | | | | |
|---|---|---|---|---|
| 2004/0007376 A1* | 1/2004 | Urdahl | ................ | H05K 1/0209 |
| | | | | 174/534 |
| 2004/0041256 A1* | 3/2004 | Takehara | ............ | H01L 23/3677 |
| | | | | 257/712 |
| 2004/0264141 A1* | 12/2004 | Spryshak | ............. | H05K 1/0206 |
| | | | | 361/719 |
| 2005/0112798 A1* | 5/2005 | Bjorbell | ............. | H01L 23/5385 |
| | | | | 438/106 |
| 2005/0135443 A1* | 6/2005 | Ayliffe | ................ | G02B 6/4201 |
| | | | | 372/36 |
| 2006/0131732 A1* | 6/2006 | Nah | .................... | H05K 1/0206 |
| | | | | 257/706 |
| 2007/0108590 A1* | 5/2007 | Lee | .................... | H01L 23/3128 |
| | | | | 257/700 |
| 2007/0227761 A1* | 10/2007 | Tuominen | ........... | H01L 23/5389 |
| | | | | 174/252 |

* cited by examiner

CARRIER PACKAGE AND CARRIER WITH PLURAL HEAT CONDUCTORS

BACKGROUND OF THE INVENTION

Field of the Invention

The present invention relates to carriers, and, more particularly, to a carrier with improved heat dissipation efficiency.

Description of Related Art

As the technology for developing electronic products is rapidly progressing towards miniaturization and high functionality, more and more electronic elements are integrated into one substrate. It is common that these electronic elements (such as LEDs) may produce a great amount of heat during operation. Therefore, heat dissipating fins are usually installed under the substrate for dissipating heat from the electronic elements.

Referring to FIG. 1, a conventional heat dissipating package is shown, comprising: a substrate 10; electrode pads 110, 110' disposed on one side of the substrate 10; electronic elements 30 disposed on the one side of the substrate 10 and electrically connected to the substrate 10 by electrode pads 110'; and heat dissipating fins 13 installed on the other side of the substrate 10 for heat dissipation.

The substrate 10 is generally made of aluminum oxide, aluminum nitride, or ceramic materials. Such substrate has poor heat dissipating capability. As a result, when the heat generated by the electronic elements during operation cannot be efficiently dissipated away from the electronic elements, due to the poor heat dissipating capability of the substrate 10, the resulting heat may reduce the performance and lifetime of the electronic elements.

Therefore there is an urgent need to develop a carrier that has better heat dissipating efficiency.

SUMMARY OF THE INVENTION

In view of the foregoing problems, the present invention provides a carrier, comprising: a main body having a first surface and a second surface opposing the first surface; a conductive part disposed on the first surface of the main body; and a plurality of heat conductors that penetrate the main body to connect with the first surface and the second surface and are free from being in contact with the conductive part.

In an embodiment, the conductive part comprises: a circuit formed on the first surface of the main body; and a plurality of electrode pads formed on the first surface of the main body and electrically connected with the circuit.

In an embodiment, the carrier further comprises conductive bumps formed on the first surface of the main body, for connecting the two heat conductors.

In an embodiment, the carrier further comprises heat sinks formed on the second surface of the main body and connected to the heat conductors.

In an embodiment, the heat sinks are a metal layer or a heat dissipating fin.

In an embodiment, the heat dissipating coefficient of the heat conductor is greater than 170 W/mK at 27° C. In an embodiment, the heat dissipating coefficient of the heat conductor is greater than 237 W/mK at 27° C. In an embodiment, the total surface areas of the heat conductors exposed from the first surface is 10% greater than of the remaining total surface area of the first surface deducted by the occupied area of the conductive part. In an embodiment, the total surface areas of the heat conductors exposed from the first surface is around 10-50% of the remaining total surface area of the first surface deducted by the occupied area of the conductive part.

In an embodiment, the size of the length, width or diameter of the heat conductors exposed from the first surface is greater than 100 micrometers.

In an embodiment, the end surface of the heat conductors exposed from the first surface is in an irregular shape, and the distance from the centroid to the edge of the end surface is greater than 50 micrometers.

In an embodiment, the heat conductors are a heat dissipating column or a heat dissipating via.

In an embodiment, the main body is made of ceramic.

In an embodiment, the heat conductors are made of metal.

In order to improve heat dissipating efficiency, a package is proposed, comprising: the above-mentioned carrier; and an electronic element mounted on and electrically connected to a first surface of the carrier.

In an embodiment, the electronic element is a semiconductor chip, a packaged or not packaged semiconductor element.

In summary, the carrier and the package of the present invention can effectively dissipate the heat generated from the electronic elements during operation, avoid any damages caused by the accumulated heat, and thereby increase the lifetime of the electronic elements by using the formation of heat conductors with a greater coefficient of thermal conductivity in the main body of the carrier.

Moreover, a proper distance is kept between each of the heat conductors to maximize the performance of heat transfer, and in addition through exposing the heat conductors from the end surface of the first surface which is 10% greater than the remaining total surface area of the first surface deducted by the occupied area of the conductive part, the heat conductors possess with even better heat dissipating capability. Compared with prior arts, the carrier disclosed by the present invention not only is capable of effectively taking away the heat from the electronic element, it also has high conductivity.

BRIEF DESCRIPTION OF DRAWINGS

The present invention can be more fully understood by reading the following detailed description of the preferred embodiments, with reference made to the accompanying drawings, wherein:

FIGS. 2A and 2B are schematic views showing the carrier in accordance with an embodiment of the present invention, wherein FIG. 2B is a cross-sectional view of FIG. 2A according to 2B and 2B cross-sectional line;

FIGS. 3A and 3B are schematic views showing the carrier of another embodiment of the present invention, wherein FIG. 3B is a cross-sectional view of FIG. 3A according to 3B-3B cross-sectional line;

FIGS. 6A and 6B are schematic views showing a package according to the present invention, wherein FIG. 6B is a cross-sectional view of FIG. 6A according to 6B-6B cross-sectional line;

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements. In addition, words such as "on", "top" and "a" are used to explain the preferred embodiment of the present invention only and should not limit the scope of the present invention.

Figure 1:
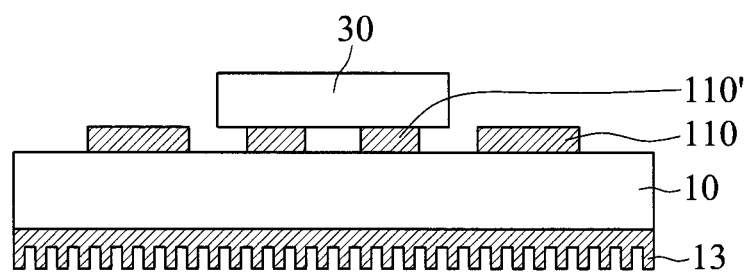
FIG. 1 is a cross-sectional view of a conventional package having heat dissipated substrate.
Figure 2A:
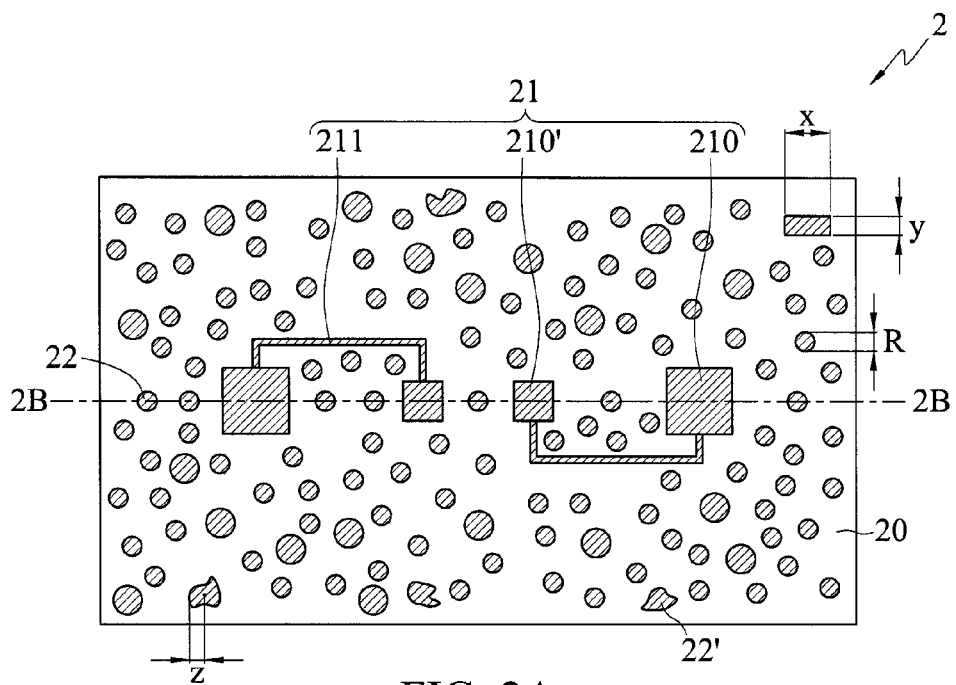
Figure 2B:
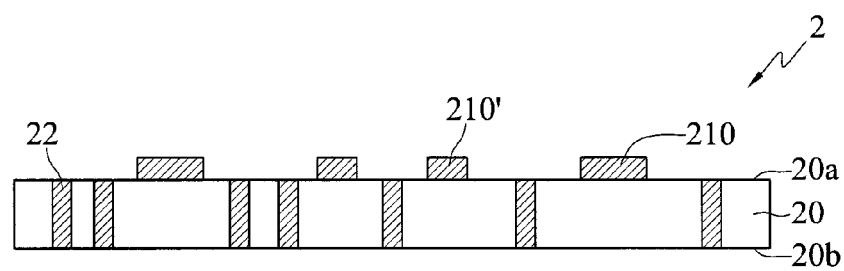

FIGS. 2A and 2B show the carrier in accordance with an embodiment of the present invention. The carrier comprises: a main body 20 having a first surface 20a and a second surface 20b opposing the first surface 20a; a conductive part 21 disposed on the first surface 20a of the main body 20; and a plurality of heat conductors 22 penetrating the main body 20 so as to connect the first surface 20a and the second surface 20b, wherein the heat conductors 22 are not in contact with the conductive part 21.

In an embodiment, the conductive part 21 comprises: a circuit 211 formed on the first surface 20a of the main body 20; and a plurality of electrode pads 210, 210' formed on the first surface 20a of the main body 20 and electrically connected with the circuit 211.

In an embodiment, the main body 20 is a ceramic, aluminum nitride, or aluminum oxide substrate. In an embodiment, the material used for making the heat conductor has heat dissipating coefficient greater than 170 W/mK, which is not limited to metal. In an embodiment, the heat conductor is made of aluminum or copper in which the heat dissipating coefficient is greater than 170 W/mK at 27° C. or even more preferably greater than 400 W/mK.

In an embodiment, the heat conductors 22 are exposed from the first surface 20a and have a shape that is not limited to any kind. As shown in FIG. 2A, the heat conductors 22' can be in any shape, such as a heat conductor column or a heat conductor via.

In an embodiment, the total surface area of the heat conductors 22 exposed from the first surface is 10% greater than the remaining total surface area of the first surface 20a deducted by the occupied area of the conductive part 21. Considered the strength of the carrier for supporting the electronic elements, the total surface area of the heat conductors 22 should preferably falls between 10% and 50% of the total surface of the first surface 20a deducted by the conductive part 21. In an embodiment, the distance between any two of the heat conductors 22 is greater than 300 micrometers.

In an embodiment, the length x, width y or diameter R of the heat conductors 22 exposed from the first surface 20a is greater than 100 micrometers. In an embodiment, the end surface of the heat conductor 22 exposed from the first surface 20a is in an irregular shape. As shown in the left corner of FIG. 2A, the distance (z) from the centroid to the edge of the end surface is greater than 50 micrometers.

Figure 3A:
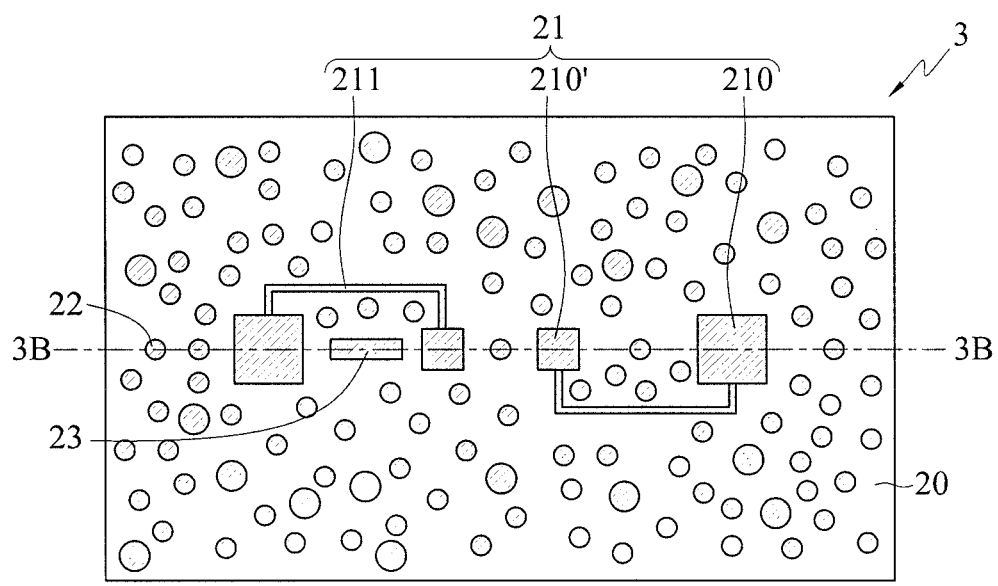
Figure 3B:
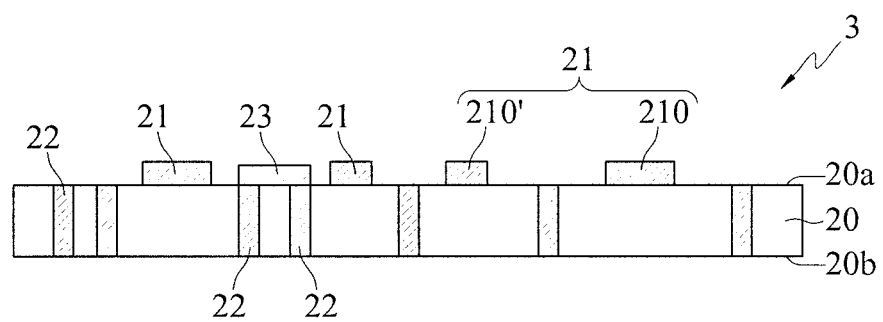

Referring to FIGS. 3A and 3B, conductive bumps 23 are formed on the first surface 20a of the main body 20 of the carrier 3. The conductive bumps 23 are used to connect any two of the heat conductors 22 to increase the heat dissipating efficiency.

Figure 4:
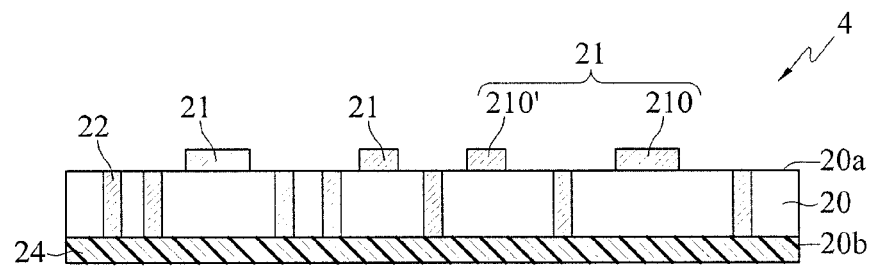
FIGS. 4 and 4' are cross-sectional view showing yet another embodiment of the present invention, wherein FIG. 4' shows the other embodiment of FIG. 4.
Figure 4:
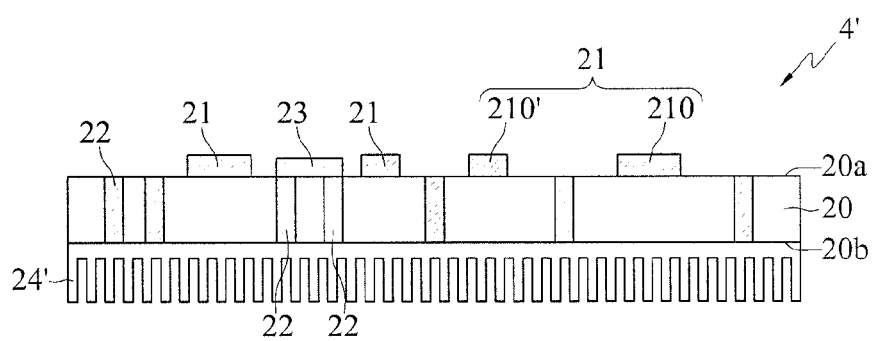

Referring to FIG. 4, the carrier according to the present invention further comprises heat sinks 24 formed on the second surface 20b of the main body 20 and connected to the heat conductors 22.

In an embodiment, the heat sink 24 is a metal layer which is formed on the second surface 20b of the main body 20 through an electro-plating method. In another embodiment, the heat sink 24' is a heat dissipating fin which can be coupled to the second surface 20b of the main body 20 via a heat conductive adhesive (not shown), as shown in the carrier 4' of FIG. 4.

Figure 5:
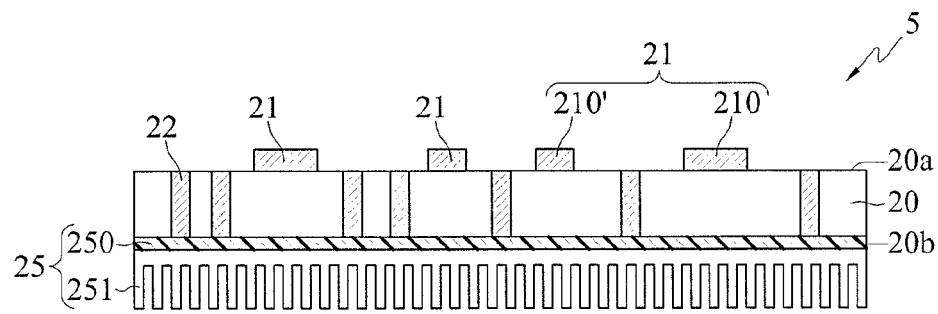
FIG. 5 is a cross-sectional schematic view of further another embodiment of the present invention.

Referring to FIG. 5, the carrier 5 differs from the carrier 4 and 4' in that heat sinks 25 are composed of a metal layer 250 and a heat dissipating fin 251.

In an embodiment, through the heat conductors, heat can be transferred to the metal layer 250 then dissipated out of the package by using the heat dissipating fin 251 on the metal layer 250, such that the heat dissipating efficiency can be improved for the carrier 5 according to the present invention.

The package according to the present invention is illustrated in FIGS. 2A to 5, including the carrier described therein.

Figure 6A:
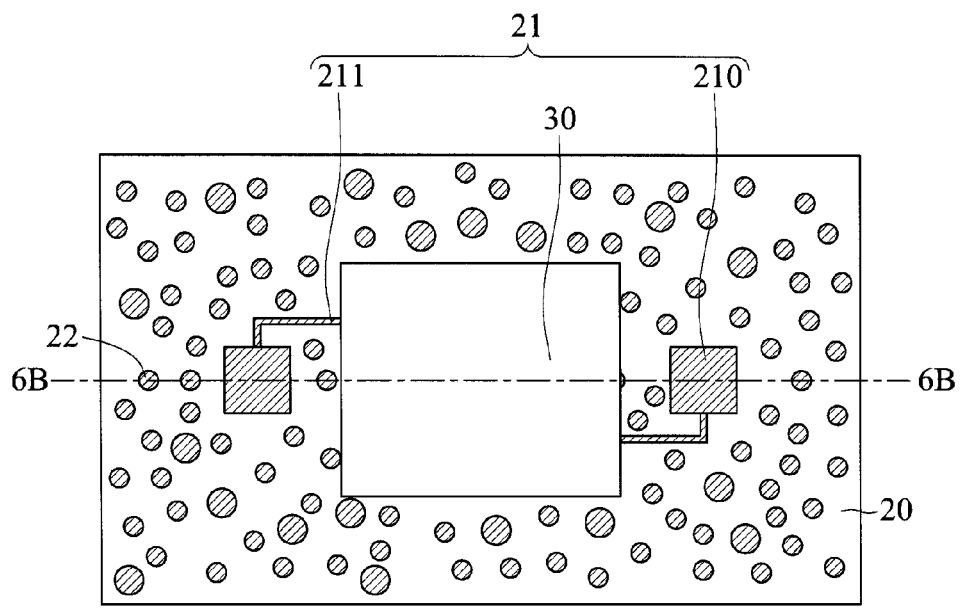
Figure 6B:
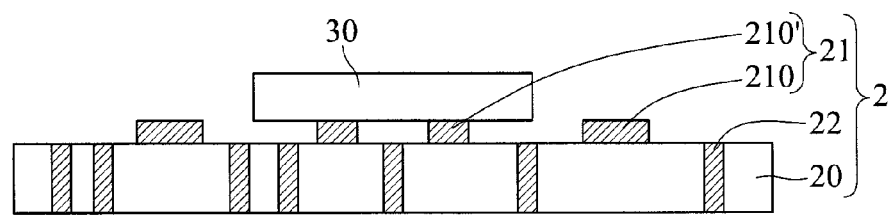

Refer to FIGS. 6A and 6B, which take the carrier 2 shown in FIGS. 2A and 2B as an example. The package according to the present invention comprises: a carrier 2 having the main body 20, the heat conductors 22 penetrating the main body 20, and a plurality of electrode pads 210, 210' disposed on the main body; and an electronic element 30 mounted on a first surface of the carrier 2 and electrically connected to the electrode pads 210' of the conductive part 21. Therefore, heat is dissipated through connecting with the heat conductor 22.

In an embodiment, the electronic element 30 does not have any specific limitation, which includes but not limited to any semiconductor chip with heat dissipating requirement, and semiconductor element which is packaged or not packaged. For instance, the electronic element include, light-emitting diodes (LED), concentrator photovoltaic (CPV) chips, high concentration photovoltaic (HCPV) chips, semiconductor field-effect transistors (MOSFET), insulated gate bipolar transistors (IGBT), etc.

In summary, the carrier according to the present invention can effectively dissipate the heat generated by the electronic element during operation, avoid any damages caused by the accumulated heat, and increase the lifetime of the electronic elements by using the formation of heat conductors with a greater coefficient of thermal conductivity in the main body of the carrier.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A carrier comprising:
   a main body having a first surface and a second surface opposing the first surface, wherein the main body is a substrate;
   a conductive part formed on the first surface of the main body; and
   a plurality of heat conductors penetrating the main body and connected with the first and second surfaces, wherein the heat conductors are free from being in electrical contact with the conductive part and any other conductive part of the carrier.

2. The carrier of claim 1, wherein the conductive part comprises:
   a circuit formed on the first surface of the main body; and
   a plurality of electrode pads formed on the first surface of the main body and electrically connected with the circuit.

3. The carrier of claim 1, further comprising a plurality of conductive bumps formed on the first surface of the main body and connected with any two of the heat conductors, wherein the conductive bumps are free from being in contact with the conductive part and any other conductive part of the carrier.

4. The carrier of claim 1, further comprising a heat sink formed on the second surface of the main body and connected with the heat conductors, wherein the heat sink is free from being in contact with the conductive part and any other conductive part of the carrier.

5. The carrier of claim 4, wherein the heat sink is a metal layer or a heat dissipating fin.

6. The carrier of claim 1, wherein the heat conductors have a heat dissipating coefficient greater than 170 W/mK.

7. The carrier of claim 6, wherein the heat dissipating coefficient of the heat conductors is greater than 237 W/mK.

8. The carrier of claim 1, wherein any two of the heat conductors are spaced at a distance greater than 300 micrometers.

9. The carrier of claim 1, wherein a total surface area of the heat conductors exposed from the first surface is 10% greater than a remaining total surface area of the first surface deducted by the occupied area of the conductive part.

10. The carrier of claim 1, wherein a total surface area of the heat conductors exposed from the first surface is 10-50% of a remaining total surface area of the first surface deducted by the occupied area of the conductive part.

11. The carrier of claim 1, wherein the heat conductors exposed from the first surface have a length, a width or a diameter greater than 100 micrometers.

12. The carrier of claim 1, wherein the heat conductors have an end surface exposed from the first surface and being in irregular shapes, and the end surface has a centroid and an edge away from the centroid at a distance greater than 50 micrometers.

13. The carrier of claim 1, wherein the heat conductors are a heat dissipating columns or heat dissipating vias.

14. The carrier of claim 1, wherein the main body is made of ceramic.

15. The carrier of claim 1, wherein the heat conductors are made of metal.

16. A package, comprising:
    the carrier of claim 1; and
    an electronic element mounted on the first surface of the carrier and electrically connected to the conductive part and heat-conductively connected with the heat conductors.

17. The package of claim 16, wherein the electronic element is a semiconductor chip, a packaged or non-packaged semiconductor element.

18. The carrier of claim 1, wherein the heat conductors are heat-conductively connected with the main body.

* * * * *